United States Patent [19]

Dearnaley

[11] 4,289,544
[45] Sep. 15, 1981

[54] INHIBITION OF FRETTING CORROSION OF METALS

[75] Inventor: Geoffrey Dearnaley, Abingdon, England

[73] Assignee: United Kingdom Atomic Energy Authority, England

[21] Appl. No.: 83,848

[22] Filed: Oct. 11, 1979

[30] Foreign Application Priority Data

Oct. 16, 1978 [GB] United Kingdom ............... 40669/78

[51] Int. Cl.³ .......................... C23F 15/00; C22F 3/00
[52] U.S. Cl. ......................................... 148/4; 148/39; 148/133; 204/192 N
[58] Field of Search ..................... 148/4, 127, 39, 133; 75/175.5, 65 EB; 204/192 N; 428/660

[56] References Cited

U.S. PATENT DOCUMENTS

| | | | |
|---|---|---|---|
| 2,902,583 | 9/1959 | Steigerwald | 75/65 EB |
| 3,529,928 | 9/1970 | Paine | 75/175.5 |
| 3,650,846 | 3/1972 | Holland et al. | 148/39 |
| 3,925,116 | 12/1975 | Engel | 204/192 N |
| 3,944,443 | 3/1976 | Jones | 148/39 |
| 3,988,955 | 11/1976 | Engel et al. | 148/39 |
| 4,105,443 | 8/1978 | Dearnaley et al. | 148/39 |
| 4,181,590 | 1/1980 | Fujishiro et al. | 204/192 N |

OTHER PUBLICATIONS

Dearnaley, *Ion Implanation*, North Holland Publishing Co., London, vol. 8, 1973, pp. 728–755.

*Primary Examiner*—Peter K. Skiff
*Attorney, Agent, or Firm*—Larson and Taylor

[57] ABSTRACT

A process for treating a titanium containing artefact to inhibit fretting corrosion, in which an active species having a higher heat of formation of its oxide than titanium is deposited on the artefact in vacuo, and the artefact is then heated sufficiently to cause the active species to migrate into the artefact to provide a surface region thereof containing the active species. Preferably the active species is deposited by an ion bombardment technique.

8 Claims, No Drawings

INHIBITION OF FRETTING CORROSION OF METALS

The present invention relates to the inhibition of fretting corrosion of metals, and more specifically, to the inhibition of fretting corrosion of titanium.

Titanium and its alloys are used extensively for aereospace and medical applications, but in circumstances where there is vibration and/or friction in an oxidising atmosphere, fretting corrosion occurs. The problem is accentuated by the consequent production of abrasive oxide wear debris. Although attempts have been made to overcome the problem by means of surface coatings, these have not been entirely successful because of the tendency of such coatings to spall when subjected to mechanical stress.

Also, such coatings may well cause dimensional changes or require further surface treatments, such as shot peening, to restore the original fatigue resistance properties of the surface.

According to the present invention there is provided a process for treating an artefact including titanium bearing surfaces to inhibit fretting corrosion thereof, comprising the operation of depositing under reduced pressure on a surface of the artefact which it is desired to protect against fretting corrosion, an active species of having a higher heat of formation of its oxide than titanium and heating the artefact to a temperature and for a period sufficient to cause the deposited active species to migrate into the artefact to provide a surface region of the artefact containing the active species.

The titanium bearing surfaces may either be pure titanium or in the form of titanium alloys.

An alternative way of expressing the required property of the active species is that it should have a lower electronegativity than titanium.

The invention depends on the ability of the active species to migrate along discontinuities in the titanium bearing material to considerable depths during the heating stage. In service, the active species block the diffusion pathways, such as grain boundaries or dislocation, by means of which oxygen diffuses into the titanium, and should any of the active species be lost from the surface of the artefact, then further active species will migrate from within the artefact to replace that which has been lost from the surface.

Suitable active species of low electronegativity are the elements barium, strontium, rubidium, europium, caesium, ytterbium and calcium. The specific active species is chosen according to the service conditions anticipated. For example, light load conditions require a more mobile active species such as caesium rather than a less mobile active species such as barium, in order to ensure that it is able to migrate effectively at the lower frictional temperatures reached by the artefact compared with those reached under more arduous conditions.

The active species can be deposited by means of ion bombardment, that is to say by exposing the artefact in a vacuum of about $10^{-6}$ torr to a beam of ions of the active species which have sufficient energy to be implanted into the artefact where they impinge on it. Such a process has the advantage that the active species is already incorporated into the artefact prior to the heating stage of the process of the present invention.

Alternatively, a sputter-ion plating technique can be used to deposit the active species. Sputter-ion plating is a process in which a glow discharge is set up in a gaseous atmosphere at a pressure of a few hundredths of a torr. The glow discharge ionises some of the gas molecules which are then accelerated towards a cathode electrode which is made of a material to be deposited on a substrate. The cathode is maintained at a potential of about 500 V which imparts sufficient energy to the impinging ions to cause them to sputter material from the cathode. The sputtered material, which usually is a mixture of ions and atoms is further ionised by the glow discharge and the ions are attracted to the substrate by means of a negative potential of about 100 V applied to it. It is usual before carrying out the sputtering and ion deposition operation to clean the substrate by applying a higher potential to it with the cathode at earth potential so that the substrate is subjected to bombardment of gaseous ions produced by the glow discharge. Applied to the present invention such a process has the advantage that any oxide layer existing on the surface of the titanium artefact will be removed prior to the deposition of the active species.

As an example of a process embodying the invention, a specimen of titanium was placed in a vacuum chamber which was evacuated to a pressure of about $10^{-6}$ torr. The specimen was then subjected to bombardment by a beam of $Ba^+$ ions until a dose of $2 \times 10^{16}$ ions per sq cm had been implanted. The ion beam energy was 200 keV. The implanted specimen was then heated to a temperature of 600° C. for an hour.

Upon subjection to oxidation corrosion and fatigue tests of a standard nature, which it is not thought necessary to describe as such tests are well known to those skilled in the metallurgical and engineering arts, it was found that the rate of oxidation of the surfaces of the specimen was reduced by about 40%, and that in service the amount of fretting corrosion was reduced similarly together with a corresponding increase in the fretting fatigue strength of the material.

The same process carried out with ions of caesium, strontium or ytterbium was found to give similar results.

I claim:

1. A process for treating a bearing surface containing titanium to inhibit fretting corrosion and improve the fretting fatigue resistance thereof, comprising the operations of depositing under reduced pressure on the said bearing surface an active species having a higher heat of formation of its oxide than titanium, and heating the bearing surface to a temperature and for a period sufficient to cause the deposited active species to migrate into the bearing surface to provide a surface region thereof containing the active species.

2. A process according to claim 1 wherein the active species is selected from the group comprising barium, calcium, caesium, europium, rubidium, strontium and ytterbium.

3. A process according to claim 2 wherein the active species is barium.

4. A process according to claim 1 wherein the concentration of the active species is of the order of $10^{16}$ atoms or ions per sq cm.

5. A process according to claim 1 wherein the active species is implanted into the artefact by an ion bombardment technique.

6. A process according to claim 5 wherein the bearing surface is subjected to bombardment by a beam of ions of the active species at an energy of the order of 200 keV until the said concentration of the active species is reached.

7. A process according to claim 1 wherein the active species is deposited by a process including the operations of subjecting the bearing surface to be protected to bombardment by ions of an inert gas to clean the surface prior to deposition of the active species by sputter-ion plating.

8. A process according to claim 1 wherein the bearing surface is heated to a temperature of the order of 600° C. subsequently to the deposition of the active species.

* * * * *